United States Patent [19]
Ueno et al.

[11] Patent Number: 5,789,311
[45] Date of Patent: Aug. 4, 1998

[54] MANUFACTURING METHOD OF SIC SCHOTTKY DIODE

[75] Inventors: Katsunori Ueno; Tatsuo Urushidani; Koichi Hashimoto; Shinji Ogino; Yasukazu Seki, all of Kanagawa, Japan

[73] Assignee: Fuji Electric Co., Ltd., Kawasaki, Japan

[21] Appl. No.: 460,619

[22] Filed: Jun. 2, 1995

[30] Foreign Application Priority Data

Sep. 26, 1994  [JP]  Japan ................... 6-228560

[51] Int. Cl.$^6$ ................................................ H01L 21/28
[52] U.S. Cl. ............................................ 438/573; 438/571
[58] Field of Search ........................ 437/100, 175, 437/176, 177, 189, 190, 194, 192, 197, 247, 912, 39; 148/139, 140, 148; 257/77, 471, 472, 473

[56] References Cited

U.S. PATENT DOCUMENTS

| | | | |
|---|---|---|---|
| 4,990,994 | 2/1991 | Furukawa et al. | 357/67 |
| 5,045,497 | 9/1991 | Hayashi et al. | 437/175 |
| 5,124,779 | 6/1992 | Furukawa et al. | 357/67 |
| 5,221,638 | 6/1993 | Ohtsuka et al. | 437/177 |
| 5,270,252 | 12/1993 | Papanicolaou | 437/176 |
| 5,270,534 | 12/1993 | Palmour | 437/100 |
| 5,389,799 | 2/1995 | Uemoto | 457/607 |
| 5,397,717 | 3/1995 | Davis et al. | 437/100 |
| 5,502,003 | 3/1996 | Ogino et al. | 437/189 |

FOREIGN PATENT DOCUMENTS

| | | | |
|---|---|---|---|
| 1-161760A | 6/1989 | Japan | 437/177 |
| 4-317374A | 11/1992 | Japan | 257/177 |
| 5-48145A | 2/1993 | Japan | 257/77 |
| 405090639 | 4/1993 | Japan | . |
| 5-335348A | 12/1993 | Japan | 437/177 |
| 6-69428A | 3/1994 | Japan | 437/177 |
| 406163892 | 6/1994 | Japan | . |

OTHER PUBLICATIONS

Ueno et al, Al/Ti Schottky Barrier Diodes With The Guard-Ping Termination for GH-SiC.
Schottky Barrier Diodes, Institute of Physis Conference Ser. No. 142.
On Silicon Carbide and Related Materials 1995, Kyoto, Japan.
K. Ueno et al., "The Al/Ti Schottky Diode of 6H-SiC Fabricated by LOCOS Process", Preprint for the 1994 Fall Meeting of The Japan Society of Applied Physics No. 19p-MH-6, (1994). (abstract in English and Japanese).
J.R. Waldrop et al., "Metal Schottky Barrier Contacts to Alpha 6H-SiC", J. Appl. Phys., 72(10):4757–4760 (1992).
J.R. Waldrop et al., "Schottky Barrier Height and Interface Chemistry of Annealed Metal Contacts to Alpha 6H-SiC: Crystal Face Dependence", J. Appl. Phys. Lett. 62(21):2685–2687 (1993).
T. Kimoto et al. "High–Voltage (>1KV) SiC Schottky Barrier Diodes With Low On–Resistances", IEEE Elect. Dev. Lett., 14(12):548–550 (1993).
D.E. Iannou et al., "The Effect of Heat Treatment on Au Schottky Contacts on β–SiC", IEEE Trans. Elect. Dev., 34(8):1694–1699.
Japanese Publication 28p–ZR–15, "The Local Oxidation of 6H–SiC Crystal" Fall 1993.
M. Bhatnagar et al. "Silicon–Carbide High Voltage (400V) Schottky Barrier Diodes", IEEE Electron Device, vol. 13, No. 10, pp. 501, 503.Letters, Oct. 1992.

*Primary Examiner*—John Niebling
*Assistant Examiner*—S. Mulpuri
*Attorney, Agent, or Firm*—Finnegan, Henderson, Farabow, Garrett & Dunner, L.L.P.

[57] ABSTRACT

A Schottky electrode is formed on an n-type SiC base member with an Al—Ti alloy or by laying Al films and Ti films alternately, and a resulting structure is subjected to a heat treatment of 600° C. to 1,200° C. A p-type SiC layer may be formed around the Schottky junction so as to form a p-n junction with the n-type SiC base member.

5 Claims, 2 Drawing Sheets

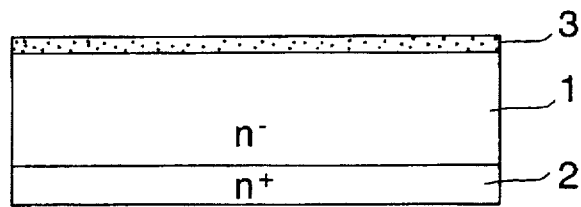
FIG. 1 (a)
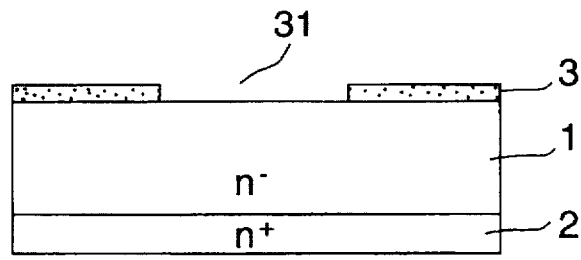
FIG. 1 (b)
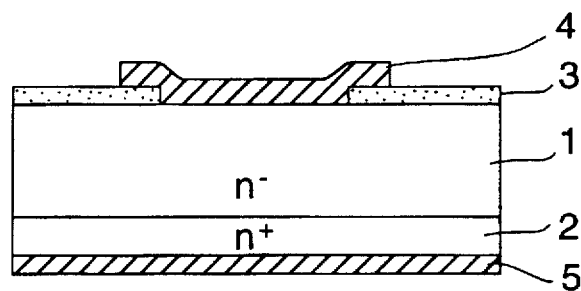
FIG. 1 (c)
FIG. 2
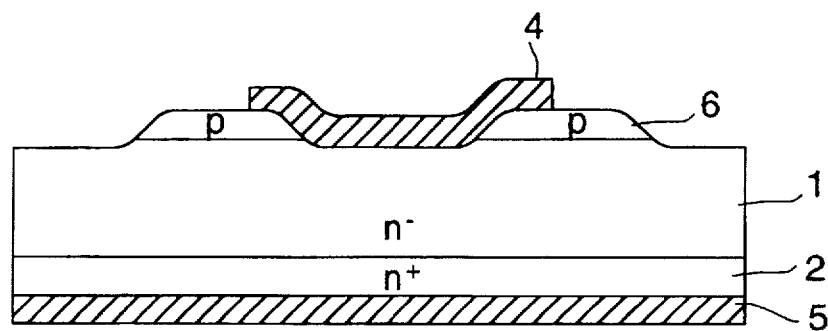

«5,789,311»

MANUFACTURING METHOD OF SIC SCHOTTKY DIODE

BACKGROUND OF THE INVENTION

The present invention relates to a manufacturing method of a SiC Schottky diode which uses silicon carbide (hereinafter referred to as SiC) as a semiconductor material and which has a high breakdown voltage and is capable of high-speed switching.

Because of its high maximum applicable electric field strength, SiC is now expected to be used for power control semiconductor devices having a high breakdown voltage. In contrast to a p-n junction diode, a Schottky diode is capable of high-speed switching because minority carriers are not involved in its operation. However, where silicon is used as a semiconductor material, a resulting Schottky diode cannot be used for an application that requires a high breakdown voltage of more than 100 V, because it has a large reverse-bias leak current and insufficient forward-bias characteristics. With an expectation of solving these problems, SiC Schottky diodes are now being produced as experiments.

Conventional SiC Schottky diodes have been reported to exhibit superior characteristics such as a high breakdown voltage and a small device resistance by employing, as a Schottky electrode, Au (T. Kimoto et al., IEEE Elect. Dev. Lett., Vol. 14, p. 548 (1993)), or Pt (M. Bhatnagar et al., IEEE Elect. Dev. Lett., Vol. 13, p. 501 (1992)).

According to the above papers, a Au or Pt Schottky electrode is formed at the room temperature or a low temperature of 300° C., and is not subjected to any additional heat treatment before evaluation of its characteristics. This is because a high-temperature heat treatment causes Au or Pt to react with SiC, to deteriorate the Schottky characteristics, particularly increase the leak current (D. E. Ioannou et al., IEEE Trans. Elect. Dev., Vol. ED-34, p. 1694 (1987)). Therefore, although SiC itself can endure a high temperature, a Schottky diode using Au or Pt cannot be used in a high-temperature environment. In addition, with insufficient adhesiveness, Au and Pt electrodes have a problem of peeling in, for instance, a cleaning process. This makes it difficult to form an electrode of a large area.

SUMMARY OF THE INVENTION

An object of the present invention is to provide, by solving the above problems, a manufacturing method of a SiC Schottky diode which can be used in a high-temperature environment, enables increase of the diode area, and is suitable for mass-production.

To attain the above object, in a manufacturing method of a SiC Schottky diode according to the invention, a Schottky electrode is formed by depositing an electrode layer including Al and Ti on an n-type SiC semiconductor base member and then subjecting the resulting structure to a heat treatment of 600° C. to 1,200° C. The Al/Ti electrode layer may be formed with an Al—Ti alloy or by laying Al films and Ti films alternately. An ohmic contact electrode may be formed with Ni on the n-type SiC base member on the side opposite to the Schottky electrode.

There may be provided additional steps of forming a p-type SiC layer on the n-type SiC base member, forming an opening in the p-type SiC layer to produce an exposed surface of the n-type SiC base member, and forming a Schottky electrode so as to contact with the exposed surface of the n-type SiC base member and cover a portion of the p-type SiC layer surrounding the opening.

A paper by J. R. Waldrop et al. (Appl. Phs. Lett., Vol. 62, No. 21, pp. 2,685–2,687 (1993)) states that a metal film including Al and Ti was formed on a 6H-SiC substrate followed by a heat treatment of 400° C. to 600° C., and a resulting Schottky barrier height was measured. However, this paper has no statement as to the breakdown voltage of a Schottky diode produced.

In the invention, the Schottky electrode is formed by depositing an electrode layer including Al and Ti and subjecting the resulting structure to a heat treatment of 600° C. to 1,200° C. In a Schottky diode produced, due to the high-temperature heat treatment, the Schottky electrode is alloyed with the SiC base member. As a result, the Schottky electrode not only adheres to the base member properly even where it is a large-sized one, but also can endure high-temperature usage. However, with this structure, electric field tends to be concentrated on the periphery of the Schottky junction when an avalanche current flows through the reversely biased junction, possibly causing a discharge at that portion. The electric field concentration can be reduced greatly by forming a p-type region in the periphery of the Schottky junction, because the Schottky electrode, which is made of Al and Ti, forms an ohmic contact with the p-type region and a p-n junction like a planar junction is formed adjacent to, i.e., connected to the Schottky junction.

BRIEF DESCRIPTION OF THE DRAWINGS

FIGS. 1(a)–1(c) are sectional views showing a manufacturing process of a SiC Schottky diode according to an embodiment of the invention;

FIG. 2 is a sectional view of a SiC Schottky diode according another embodiment of the invention.

DESCRIPTION OF THE PREFERRED EMBODIMENTS

Figure 3:
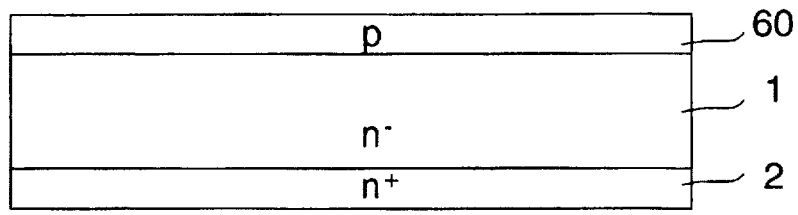
FIGS. 3(a)–3(d) are sectional views showing a manufacturing method of the SiC Schottky diode of FIG. 2.
Figure 3:
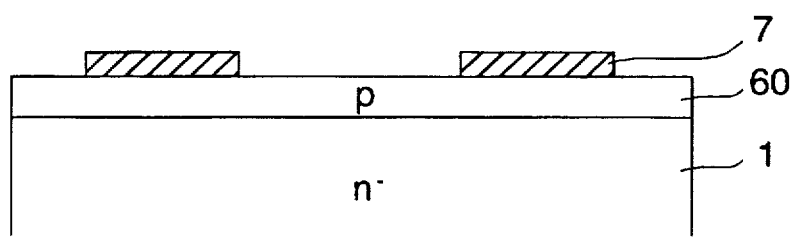
Figure 3:
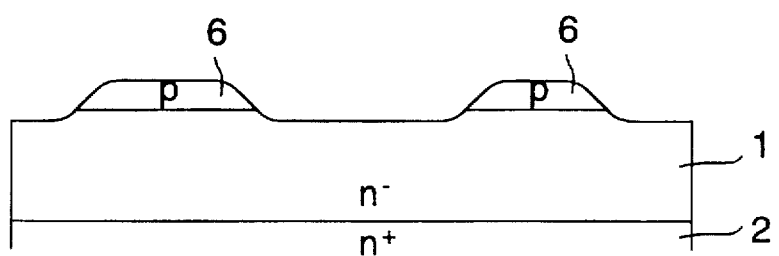
Figure 3:
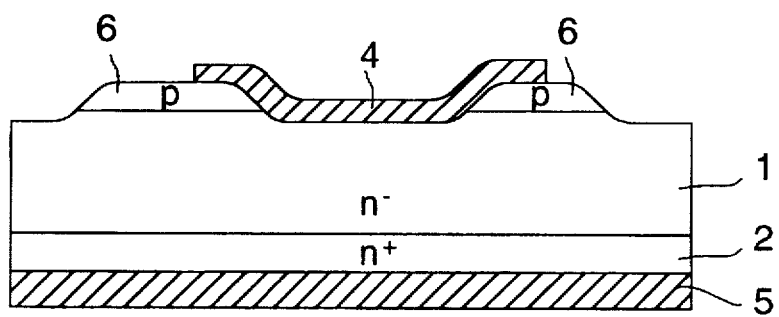

Embodiments of the present invention will be hereinafter described with reference to the accompanying drawings.

FIGS. 1(a)–1(c) show a manufacturing process of a SiC Schottky diode according to an embodiment of the invention.

First, a high-impurity-concentration SiC single crystal substrate 2 having a low resistivity of 0.02 Ωcm or less. After a low-impurity-concentration n⁻layer 1 is formed on the substrate 2 by epitaxial growth, a thermal oxidation film 3 is formed as an insulating film for protecting the surface of the n⁻layer 1 (see FIG. 1(a)).

An opening 31 is formed in the thermal oxidation film 3 (see FIG. 1(b)). Then, a film of an Al—Ti alloy (Al: 50%; Ti: 50%) is formed over the entire surface, and patterned by etching into a Schottky electrode layer 4. The Al—Ti alloy film is deposited by sputtering or evaporation using separate Al and Ti sources or an Al—Ti alloy source. Alternatively, Al films and Ti films may be laid alternately by sputtering or evaporation at a thickness ratio of 4.5:2.7, which is reverse to the specific gravity ratio of Al to Ti. The patterning by etching is performed by dry etching such as plasma etching or wet etching with a phosphoric/nitric acid or hydrofluoric acid.

Then, a Ni layer 5, which is an example of a metal electrode layer capable of forming a superior ohmic contact with n-type SiC, is formed on the surface of the back side n⁺layer 2 (see FIG. 1(c)). The structure is thereafter subjected to a heat treatment of 600° C. to 1,200° C. Thus, a Schottky junction and an ohmic junction are formed on the front side n⁻layer 1 and the back side n⁺layer 2, respectively.

A Schottky diode product manufactured in the above manner had a breakdown voltage of 250 V and the n⁻layer 1 whose impurity concentration was $4 \times 10^{17}$ cm$^{-3}$. These values correspond to a maximum applicable electric field strength of $2 \times 10^6$ V/cm, which is sufficiently high. The same diode product showed a leak current of $10^{-5}$ A/cm$^2$ at 100 V, which is within the practical range.

FIG. 2 is a sectional view showing a structure of a Schottky diode according to another embodiment of the invention. In FIG. 2, the same parts as in FIGS. 1(a)–1(c) are given the same reference numerals. To prevent electric field concentration at the periphery of the Schottky junction, a p-type region 6 that forms a p-n junction with the n⁻layer 1 is formed around the Schottky junction formed by the n⁻layer 1 and the Al/Ti electrode layer 4. The Al—Ti alloy film or the Al/Ti multilayered film, which is a Schottky electrode on n-type SiC, forms an ohmic contact with p-type SiC. Therefore, there is formed a parallel connection of the Schottky junction and the p-n junction; i.e., an almost planar junction structure consisting of the two kinds of adjacent junctions. With this structure, the electric field concentration at the periphery of the Schottky electrode 4 can be greatly reduced.

FIGS. 3(a)–3(d) show a manufacturing process of the Schottky diode of FIG. 2. In this process, after an n⁻layer 1 is formed on an n⁺SiC substrate 2 by epitaxial growth, a p-type SiC layer 60 of about 1 μm in thickness is formed thereon at an impurity concentration of about $10^{17}$ cm$^{-3}$ (see FIG. 3(a)). A p-type SiC region 6 and an exposed portion of the n⁻layer 1 inside the region 6 are produced by forming a resist pattern 7 on the p-type layer 60 (see FIG. 3(b)) and partially removing the p-type layer 60 by dry etching or selective oxidation (see FIG. 3(c)).

Then, a Schottky electrode layer 4 and an ohmic electrode layer 5 are formed in the same manner as in the steps for producing the FIG. 1(c) structure, and the resulting structure is subjected to annealing of 600° C. to 1,200° C. Thus, a Schottky diode exhibiting a high breakdown voltage in a more stable manner is obtained (see FIG. 3(d)).

According to the invention, by forming the Al/Ti Schottky electrode layer and subjecting the resulting structure to a high-temperature heat treatment, the Schottky diode can be produced which uses SiC as the semiconductor material, can be used in a high-temperature environment, and can have an increased capacity and size. Further, the invention enables mass-production of such a Schottky diode.

What is claimed is:

1. A method of manufacturing a SiC Schottky diode, comprising the steps of:

depositing an electrode layer including aluminum and titanium directly on an n-type SiC semiconductor base member; and subjecting the SiC semiconductor base member having the electrode layer deposited thereon to a heat treatment of 600° C. to 1,200° C., to thereby form a Schottky electrode.

2. The manufacturing method of claim 1, wherein the electrode layer includes an aluminum-titanium alloy.

3. The manufacturing method of claim 1, wherein the electrode layer includes aluminum films and titanium films that a laid alternately.

4. The manufacturing method of claim 1, further comprising the steps of:

forming a p-type SiC layer on the n-type SiC base member;

forming an opening in the p-type SiC layer to produce an exposed surface of the n-type SiC base member; and forming a Schottky electrode so as to contact with the exposed surface of the n-type SiC base member and cover a portion of the p-type SiC layer surrounding the opening.

5. The manufacturing method of claim 1, further comprising the step of forming, with nickel, an ohmic contact electrode on the n-type SiC base member on a side opposite to the Schottky electrode.

* * * * *

UNITED STATES PATENT AND TRADEMARK OFFICE
CERTIFICATE OF CORRECTION

PATENT NO. : 5,789,311
DATED : August 04, 1998
INVENTOR(S) : Katsunori UENO et al.

It is certified that error appears in the above-indentified patent and that said Letters Patent is hereby corrected as shown below:

On the title page, item [54] and column 1, line 1, "SIC" should read --SiC--.

Claim 3, Column 4, line 23, "a laid" should read --are laid--.

Signed and Sealed this

Thirty-first Day of August, 1999

*Attest:*

Q. TODD DICKINSON

*Attesting Officer*     Acting Commissioner of Patents and Trademarks